United States Patent
Colli

(10) Patent No.: US 10,651,792 B2
(45) Date of Patent: May 12, 2020

(54) OSCILLATOR APPARATUS AND ASSOCIATED METHODS

(71) Applicant: Nokia Technologies Oy, Espoo (FI)

(72) Inventor: Allan Colli, Cambridge (GB)

(73) Assignee: Nokia Technologies Oy, Espoo (FI)

(*) Notice: Subject to any disclaimer, the term of this patent is extended or adjusted under 35 U.S.C. 154(b) by 17 days.

(21) Appl. No.: 16/063,148

(22) PCT Filed: Nov. 24, 2016

(86) PCT No.: PCT/FI2016/050825
§ 371 (c)(1),
(2) Date: Jun. 15, 2018

(87) PCT Pub. No.: WO2017/109275
PCT Pub. Date: Jun. 29, 2017

(65) Prior Publication Data
US 2018/0367098 A1    Dec. 20, 2018

(30) Foreign Application Priority Data

Dec. 23, 2015 (EP) .................................... 15202321

(51) Int. Cl.
*H03B 5/36* (2006.01)
*H03B 5/32* (2006.01)
*H01L 41/047* (2006.01)

(52) U.S. Cl.
CPC ......... *H03B 5/326* (2013.01); *H01L 41/0478* (2013.01); *H03B 5/362* (2013.01); *H03B 5/364* (2013.01)

(58) Field of Classification Search
CPC ......... H03B 5/326; H03B 5/362; H03B 5/364
See application file for complete search history.

(56) References Cited

U.S. PATENT DOCUMENTS 5,789,845 A * 8/1998 Wadaka ................. H03B 5/326
310/334
8,692,624 B2 * 4/2014 Frank ..................... H03B 5/364
331/107 A (Continued)

FOREIGN PATENT DOCUMENTS

CN       104716924 A    6/2015
EP         0771070 A2    5/1997

(Continued)

OTHER PUBLICATIONS

Burkland, W. A., et al. "A thin-film bulk-acoustic-wave resonator-controlled oscillator on silicon." IEEE electron device letters 8.11 (1987): 531-533. (Year: 1987).*

(Continued)

*Primary Examiner* — Ryan Johnson
(74) *Attorney, Agent, or Firm* — Harrington & Smith

(57) ABSTRACT

An apparatus includes a film bulk acoustic resonator and a field effect transistor. The film bulk acoustic resonator includes first and second electrodes separated by a piezoelectric material. The piezoelectric material is configured such that the application of a potential difference between the first and second electrodes enables the generation of an acoustic wave and associated surface charge in the piezoelectric material. The field effect transistor includes a channel, and source and drain electrodes configured to enable a flow of electrical current through the channel when a potential difference is applied between the source and drain electrodes. The surface charge generated in the piezoelectric material induces a corresponding charge in the first electrode causing a variation in the electrical current flowing through the channel via a portion of the first electrode, the variation in electrical current producing an output signal having a frequency corresponding to that of the acoustic wave.

18 Claims, 4 Drawing Sheets

(56) References Cited

U.S. PATENT DOCUMENTS

| | | |
|---|---|---|
| 2002/0190802 A1 | 12/2002 | Ruffieux |
| 2005/0099236 A1 | 5/2005 | Kawakubo et al. |
| 2012/0164753 A1 | 6/2012 | Johnston et al. |
| 2012/0228993 A1 | 9/2012 | Colli |
| 2013/0234559 A1 | 9/2013 | Ermolov |
| 2014/0022025 A1 | 1/2014 | Jenkins et al. |

FOREIGN PATENT DOCUMENTS

| | | |
|---|---|---|
| EP | 2653844 A1 | 10/2013 |
| EP | 3015833 A1 | 5/2016 |
| EP | 3015834 A1 | 5/2016 |
| EP | 3016145 A1 | 5/2016 |
| GB | 2516247 A | 1/2015 |
| WO | 2007/030423 A2 | 3/2007 |
| WO | 2012/069882 A1 | 5/2012 |
| WO | 2013/085136 A1 | 6/2013 |
| WO | 2015/012914 A2 | 1/2015 |

OTHER PUBLICATIONS

Qian et al., "Graphene as a Massless Electrode for Ultrahigh-Frequency Piezoelectric Nanoelectromechanical Systems", Nano Letters, vol. 15, No. 07, 2015, pp. 4599-4604.

"Graphene—From a Wonder Material to the Application in Mobile Communication", Fraunhofer, Fraunhofer Institute for Applied Solid State Physics, Retrieved on Jun. 11, 2018, Webpage available at : https://www.iaf.fraunhofer.de/en/media/press-releases/press-2015-03-23.html.

Lin et al., "100-GHz Transistors from Wafer-Scale Epitaxial Graphene", Science, vol. 327, No. 5966, Feb. 5, 2010, pp. 662-662.

Guerriero et al.,"Gigahertz Integrated Graphene Ring Oscillators", ACS Nano, vol. 07, No. 06, 2013, pp. 5588-5594.

Wang et al., "Graphene Frequency Multipliers", IEEE Electron Device Letters, vol. 30, No. 5, May 2009, pp. 547-549.

Dragoman et al., "High Performance Thin Film Bulk Acoustic Resonator Covered with Carbon Nanotubes", Applied Physics Letters, vol. 89, No. 14, Oct. 6, 2006, 3 pages.

Yang et al., "Triple-Mode Single-Transistor Graphene Amplifier and Its Applications", ACS Nano, vol. 04, No. 10, Oct. 12, 2010, pp. 5532-5538.

Wang et al., "A High-Performance Top-Gate Graphene Field-Effect Transistor Based Frequency Doubler", Applied Physics Letters, vol. 96, No. 17, Apr. 27, 2010, 3 pages.

Kaul et al., "Carbon Nanofiber-Based, High-Frequency, High-Q, Miniaturized Mechanical Resonators", NASA Tech Brief, Jun. 1, 2011, pp. 9-10.

Extended European Search Report received for corresponding European Patent Application No. 15202321.4, dated Jun. 17, 2016, 11 pages.

Lekas et al., "Noise Modeling of Graphene Resonant Channel Transistors", IEEE Transactions on Electron Devices, vol. 62, No. 4, Apr. 2015, pp. 1276-1283.

Dragoman, "High Frequency Carbon Nanostructures that Smell, Weight, Harvest and Handle", International Semiconductor Conference, Sep. 17-Oct. 15, 2007, pp. 25-32.

International Search Report and Written Opinion received for corresponding Patent Cooperation Treaty Application No. PCT/FI2016/050825, dated Mar. 17, 2017, 16 pages.

Office action received for corresponding European Patent Application No. 15202321.4, dated May 15, 2019, 8 pages.

* cited by examiner

OSCILLATOR APPARATUS AND ASSOCIATED METHODS

RELATED APPLICATION

This application was originally filed as PCT Application No. PCT/FI2016/050825 filed Nov. 24, 2016 which claims priority benefit from EP Patent Application No. 15202321.4 filed Dec. 23, 2015.

TECHNICAL FIELD

The present disclosure relates particularly to electronic oscillator circuits, associated methods and apparatus. Certain embodiments specifically concern an apparatus comprising a film bulk acoustic resonator and a field effect transistor configured such that an acoustic wave generated within the film bulk acoustic resonator can be used to gate the field effect transistor and produce an output signal having a frequency corresponding to that of the acoustic wave. Some embodiments may relate to portable electronic devices, in particular, so-called hand-portable electronic devices which may be hand-held in use (although they may be placed in a cradle in use). Such hand-portable electronic devices include so-called Personal Digital Assistants (PDAs) and tablet PCs.

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Research is currently being done to develop new oscillator circuits for use in telecommunications and the like.

The listing or discussion of a prior-published document or any background in this specification should not necessarily be taken as an acknowledgement that the document or background is part of the state of the art or is common general knowledge.

SUMMARY

According to a first aspect, there is provided an apparatus comprising a film bulk acoustic resonator and a field effect transistor,
the film bulk acoustic resonator comprising first and second electrodes separated by a piezoelectric material, the piezoelectric material configured such that the application of a potential difference between the first and second electrodes enables the generation of an acoustic wave and associated surface charge in the piezoelectric material,
the field effect transistor comprising a channel, and source and drain electrodes configured to enable a flow of electrical current through the channel when a potential difference is applied between the source and drain electrodes,
wherein the first electrode of the film bulk acoustic resonator comprises electrically connected first and second portions, the second portion capacitively coupled to the channel of the field effect transistor via a dielectric material, and
wherein the first portion of the first electrode is capacitively coupled to the piezoelectric material such that the surface charge generated in the piezoelectric material induces a corresponding charge in the first electrode which causes a variation in the electrical current flowing through the channel via the second portion of the first electrode, the variation in electrical current producing an output signal having a frequency which corresponds to that of the acoustic wave.

The field-effect transistor may comprise a gate electrode separated from the channel by a dielectric material, and the gate electrode may be configured to enable the frequency of the output signal to be controlled by applying a voltage to the gate electrode.

The first portion of the first electrode may have a greater area than the second portion of the first electrode.

The first portion of the first electrode may have an area of at least 2, 3, 4, 5, 10, 20, 30, 50 or 100 times the area of the second portion of the first electrode.

One or more of the channel, the source electrode, the drain electrode, the gate electrode, the first electrode and the second electrode may be formed from a conductive two-dimensional material.

The conductive two-dimensional material may comprise one or more of graphene, reduced graphene oxide, a graphene-like material, and a two-dimensional dichalcogenide.

The graphene-like material may comprise one or more of phosphorene, silicene, germanene, stanene, GaN, InN, InP, InAs, BAs and GaP.

The transition metal dichalcogenide may comprise one or more of $WX_2$, $MoX_2$, $ScX_2$, $TiX_2$, $HfX_2$, $ZrX_2$, $VX_2$, $CrX_2$, $MnX_2$, $FeX_2$, $CoX_2$, $NiX_2$, $NbX_2$, $TcX_2$, $ReX_2$, $PdX_2$ and $PtX_2$, where $X=S$, Se or Te.

The conductive two-dimensional material from which the channel is formed may exhibit ambipolar conductivity.

The conductive two-dimensional material from which the channel is formed may be substantially free of chemical dopants.

The conductive two-dimensional material from which the channel is formed may comprise one or more chemical dopants configured to vary its electrical conductivity.

The field effect transistor may be formed on the piezoelectric material of the film bulk acoustic resonator.

The piezoelectric material may be configured such that the generated acoustic wave has a frequency of up to 1 GHz, 2 GHz, 5 GHz, 10 GHz, 50 GHz or 100 GHz.

The piezoelectric material may comprise one or more of lead zirconate titanate, lead titanate, zinc oxide, aluminium nitride, graphene oxide, polytetrafluoroethylene, polypropylene, polyurethane and polyvinylidene fluoride.

The piezoelectric material may have a thickness of up to 100 nm, 200 nm, 500 nm or 1 μm.

The apparatus may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, an oscillator, and a module for one or more of the same.

According to a further aspect, there is provided a method of using an apparatus, the apparatus comprising a film bulk acoustic resonator and a field effect transistor, the film bulk acoustic resonator comprising first and second electrodes separated by a piezoelectric material, the piezoelectric material configured such that the application of a potential difference between the first and second electrodes enables the generation of an acoustic wave and associated surface charge in the piezoelectric material, the field effect transistor comprising a channel, and source and drain electrodes configured to enable a flow of electrical current through the channel when a potential difference is applied between the source and drain electrodes, wherein the first electrode of the film bulk acoustic resonator comprises electrically connected first and second portions, the second portion capacitively coupled to the channel of the field effect transistor via a dielectric material, and wherein the first portion of the first electrode is capacitively coupled to the piezoelectric material such that the surface charge generated in the piezoelectric material induces a corresponding charge in the first electrode which causes a variation in the electrical current flowing through the channel via the second portion of the first electrode, the variation in electrical current producing an output signal having a frequency which corresponds to that of the acoustic wave, the method comprising applying a potential difference between the first and second electrodes of the film bulk acoustic resonator to produce an output signal having a frequency which corresponds to that of the resulting acoustic wave.

The method may comprise varying the potential difference between the source and drain electrodes of the field effect transistor to control the frequency of the output signal.

The field effect transistor may comprise a gate electrode separated from the channel by a dielectric material, and the method may comprise applying a voltage to the gate electrode to control the frequency of the output signal.

According to a further aspect, there is provided a method of making an apparatus, the method comprising forming a film bulk acoustic resonator and a field effect transistor, the film bulk acoustic resonator comprising first and second electrodes separated by a piezoelectric material, the piezoelectric material configured such that the application of a potential difference between the first and second electrodes enables the generation of an acoustic wave and associated surface charge in the piezoelectric material, the field effect transistor comprising a channel, and source and drain electrodes configured to enable a flow of electrical current through the channel when a potential difference is applied between the source and drain electrodes, wherein the first electrode of the film bulk acoustic resonator comprises electrically connected first and second portions, the second portion capacitively coupled to the channel of the field effect transistor via a dielectric material, and wherein the first portion of the first electrode is capacitively coupled to the piezoelectric material such that the surface charge generated in the piezoelectric material induces a corresponding charge in the first electrode which causes a variation in the electrical current flowing through the channel via the second portion of the first electrode, the variation in electrical current producing an output signal having a frequency which corresponds to that of the acoustic wave.

The steps of any method disclosed herein do not have to be performed in the exact order disclosed, unless explicitly stated or understood by the skilled person.

Corresponding computer programs for implementing one or more steps of the methods disclosed herein are also within the present disclosure and are encompassed by one or more of the described example embodiments.

One or more of the computer programs may, when run on a computer, cause the computer to configure any apparatus, including a battery, circuit, controller, or device disclosed herein or perform any method disclosed herein. One or more of the computer programs may be software implementations, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

One or more of the computer programs may be provided on a computer readable medium, which may be a physical computer readable medium such as a disc or a memory device, or may be embodied as a transient signal. Such a transient signal may be a network download, including an internet download.

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which.

DESCRIPTION OF SPECIFIC ASPECTS/EMBODIMENTS

Figure 1:
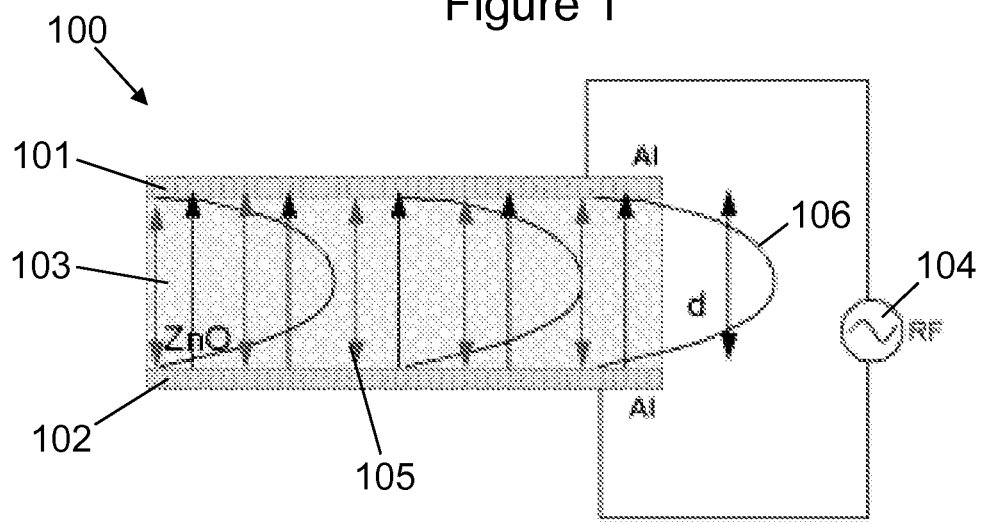
FIG. 1 shows one example of a film bulk acoustic resonator.

FIG. 1 shows one example of a film bulk acoustic resonator (FBAR) 100. An FBAR 100 comprises two metal electrodes 101, 102 separated by a piezoelectric thin film 103. Piezoelectric materials 103 convert electrical energy into mechanical energy and vice versa. When an alternating potential difference 104 (input signal) is applied between the metal electrodes 101, 102, a varying electric field 105 is produced perpendicular to the thickness of the piezoelectric thin film 103 which polarises the material 103. This varying electric field 105 creates an acoustic wave 106 and associated surface charge in the piezoelectric thin film 103 which propagates longitudinally through the film 103. A resonance condition occurs if the thickness "d" of the piezoelectric thin film 103 is equal to an integer multiple of half of the wavelength of the acoustic wave 106. The fundamental resonant frequency $f_{res}$ is given by $f_{res}=v_a/2d$, where $v_a$ is the acoustic wave velocity at the resonant frequency. The main advantage of piezoelectric resonators 100 over analogue electrical resonators is their larger Q-factor, which is a key requirement in many applications.

FBAR devices 100 are currently being developed which operate in the 1-5 GHz frequency range used by WiFi™ and mobile communication systems. As long as telecommunication technologies advance, however, there is a growing need for resonators that operate a frequencies of up to several tens of GHz. Future FBAR applications will eventually be limited by the thickness of the layers 101-103 that constitute the resonators and the increasing sensitivity towards thickness deviations of these layers. As a rule of thumb, the fundamental frequency of a 1 µm thick aluminium nitride piezoelectric resonator 100 is around 1-2 GHz. An operational frequency of several tens of GHz would therefore require layers of less than 100 nm in thickness, which is a challenging limit.

There will now be described an apparatus and associated methods that may address this issue.

Figure 2:
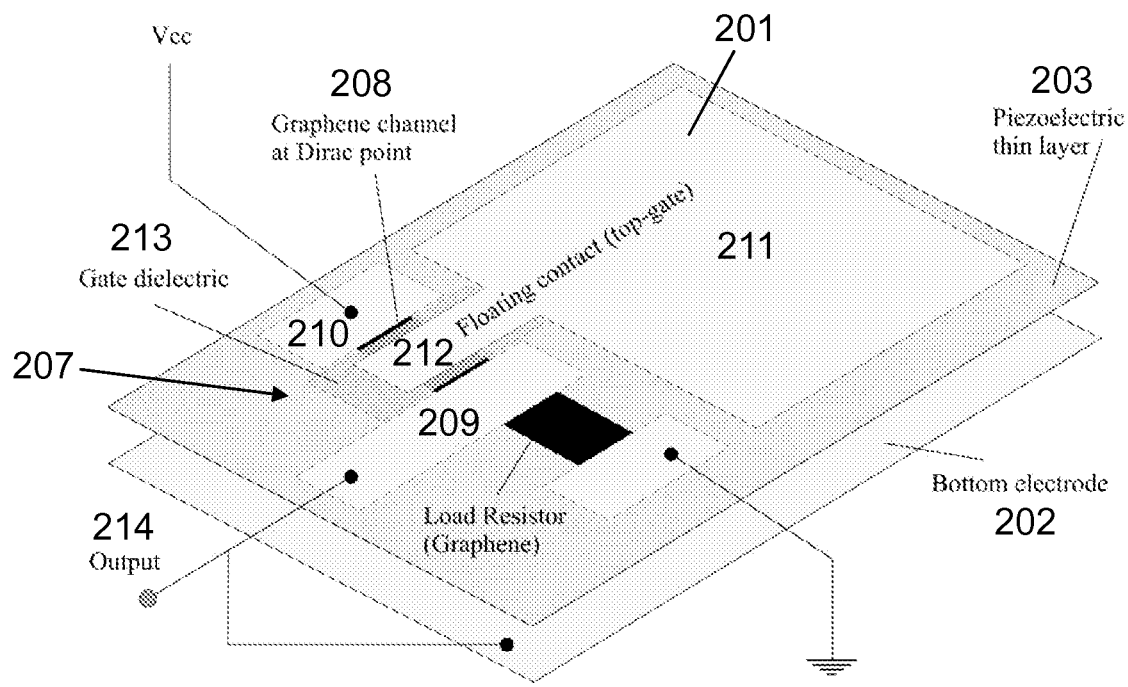
FIG. 2 shows one example of the present apparatus.

FIG. 2 shows one example of the present apparatus. The apparatus comprises an FBAR 200 and a field effect transistor 207 (FET). The FBAR 200 comprises first 201 and second 202 electrodes separated by a piezoelectric material 203, the piezoelectric material 203 configured such that the application of a potential difference between the first 201 and second 202 electrodes enables the generation of a bulk or surface acoustic wave and associated surface charge in the piezoelectric material 203. The FET 207 comprises a channel 208, and source 209 and drain 210 electrodes configured to enable a flow of electrical current through the channel 208 when a potential difference $V_{cc}$ is applied between the source 209 and drain 210 electrodes.

The first electrode 201 of the FBAR 200 comprises electrically connected first 211 and second 212 portions, the second portion 212 capacitively coupled to the channel 208 of the field effect transistor 207 via a dielectric material 213. Furthermore, the first portion 211 of the first electrode 201 is capacitively coupled to the piezoelectric material 203 such that the surface charge generated in the piezoelectric material 203 induces a corresponding charge in the first electrode 201. The induced charge in the first electrode 201 causes a variation in the electrical current flowing through the channel 208 via the second portion 212 of the first electrode 201 which produces an output signal 214 having a frequency corresponding to that of the acoustic wave (which may be up to 1 GHz, 2 GHz, 5 GHz, 10 GHz, 50 GHz or 100 GHz).

Figure 3:
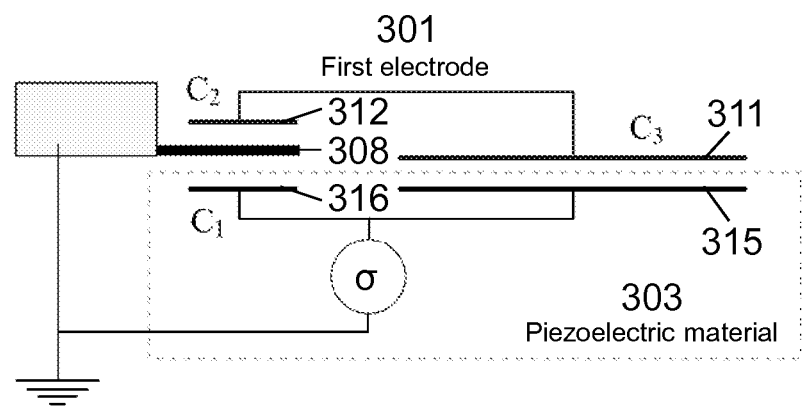
FIG. 3 shows the capacitive coupling between the channel, piezoelectric material and first electrode of the apparatus of FIG. 2.

FIG. 3 illustrates the capacitive coupling between the channel 308, the piezoelectric material 303 and first electrode 301 of the present apparatus. As mentioned above, the acoustic wave generated in the piezoelectric material 303 gives rise to surface charge. This charge is bound within the crystal structure of the piezoelectric material 303 and is therefore not free to flow to the first electrode 301 of the FBAR as an electrical current. As a result, the region 315 of the piezoelectric material 303 in proximity to the first portion 311 of the first electrode 301 (i.e. the first region 315) is capacitively coupled to the first portion 311 of the first electrode 301. The first region 315 of the piezoelectric material 303 therefore acts as one plate of a capacitor $C_3$ and the first portion 311 of the first electrode 301 acts as the opposing plate of this capacitor $C_3$.

The first electrode 301 of the FBAR is electrically isolated (hence the term "floating contact" in FIG. 2). The charge induced in the first portion 311 of the first electrode 301 by the first region 315 of the piezoelectric material 303 is therefore drawn from the second portion 312 of the first electrode 301 (as this is the only charge reservoir available). This causes the second portion 312 of the first electrode 301 to become charged also. Since the second portion 312 of the first electrode 301 is separated from the channel 308 of the FET by a dielectric material, the second portion 312 and channel 308 act as opposing plates of another capacitor $C_2$. Furthermore, in this example the FET is formed on top of the piezoelectric material 303 of the FBAR resonator such that the channel 308 is in direct physical contact with a second region 316 of the piezoelectric material 303. Since the surface charge created by the acoustic wave is bound within the crystal structure of the piezoelectric material 303, the second region 316 and channel 308 act as opposing plates of a further capacitor $C_1$.

In effect, the channel 308 of the FET is gated not only by the surface charge of the second region 316 of the piezoelectric material 303 (i.e. direct gating), but also by the charge induced in the second portion 312 of the first electrode 301 (i.e. indirect gating). Capacitively coupling the first electrode 301 of the FBAR to both the piezoelectric material 303 of the FBAR and the channel 308 of the FET therefore results in an increase in the sensitivity of the electrical current flowing through the channel 308 to the acoustic wave in the piezoelectric material 303.

In some cases (as shown in FIGS. 2 and 3), the first portion 311 of the first electrode 301 may have a greater area than the second portion 312 of the first electrode 301. This feature serves to increase the sensitivity of the apparatus even further. The acoustic wave within the piezoelectric material 303 produces a fixed amount of charge per unit area σ. The electrostatic potential $V_3$ generated at capacitor $C_3$ does not depend on the geometry of $C_3$ ($V_3=Q_3/C_3$ with $Q_3=\pi \times A_3$. If the area $A_3$ of $C_3$ doubles, both $Q_3$ and $C_3$ double and $V_3$ stays constant). However, the charge $Q_3$ needed at $C_3$ to screen/balance the surface charge of the piezoelectric material 303 comes from $C_2$ because the first electrode 301 is electrically isolated. For capacitors in series, $Q_2=Q_3$, and therefore the gate potential applied to the channel 308 is $V_2=Q_2/C_2=Q_3/C_2=V_3 \times C_3/C_2$. So, the apparatus acts to amplify the gate voltage $V_1$ at capacitor $C_1$ with an additional gate voltage $V_2$ that scales with the capacitance ratio $C_3/C_2$. In this way, the greater the area of the first portion 311 of the first electrode 301 relative to the second portion 312 of the first electrode 301, the greater the $C_3/C_2$ ratio and the sensitivity of the channel current to the acoustic wave. The sensitivity of the apparatus can therefore be increased at the expense of device area. In practice, the first portion 311 of the first electrode 301 may be at least 2, 3, 4, 5, 10, 20, 30, 50 or 100 times the area of the second portion 312 of the first electrode 301.

Figure 4:
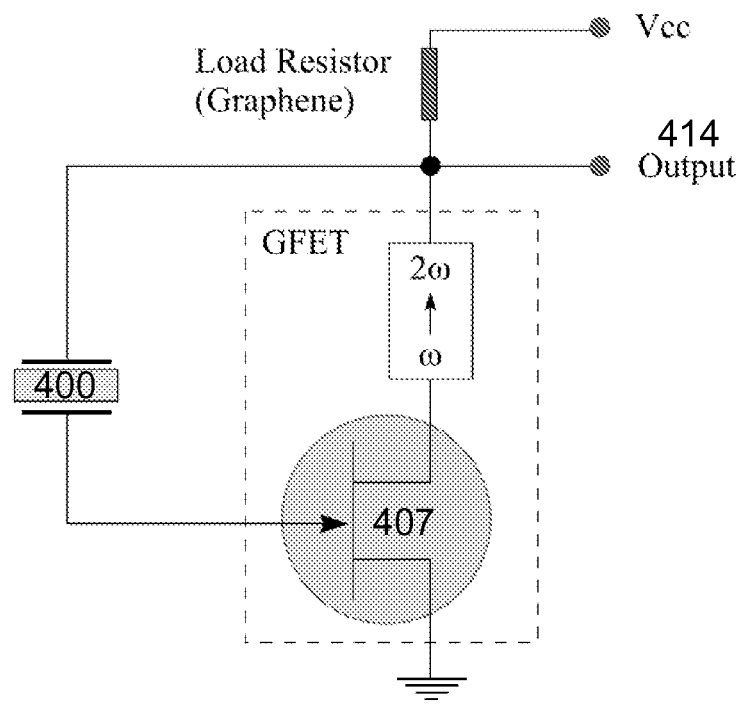
FIG. 4 shows the equivalent circuit for the apparatus of FIG. 2.

FIG. 4 shows the equivalent circuit for the apparatus of FIG. 2. This is a crystal oscillator circuit configured such that the FET 407 is connected in a feedback loop with its output fed back into its input through the FBAR 400 to provide positive feedback. When the power supply $V_{cc}$ to the circuit is first switched on, electronic noise in the circuit provides a non-zero signal to get the oscillations started. The noise travels around the loop and is amplified and filtered until it quickly converges on a sine wave at a single frequency. The FBAR 400 can be viewed as a highly selective frequency filter in the circuit because it passes a narrow sub-band of frequencies around the resonant frequency and attenuates everything else. As the FET 407 amplifies the signals coming out of the FBAR 400, the signals in the FBAR frequency band become stronger and eventually dominate the output signal 414.

Typically with this type of circuit, the fundamental mode of the resonance frequency will prevail over higher harmonics because the gain intrinsically decreases with frequency. It has been found, however, that it is possible to obtain output signals 414 with frequencies corresponding to the higher harmonics of the FBAR resonance if graphene is used to form the FET channel (i.e. a graphene field effect transistor, GFET). This is because graphene has no bandgap and switches from p-type behaviour to n-type behaviour suddenly upon crossing the Dirac point (i.e. graphene exhibits strong ambipolar conductivity). In this scenario, the gain of the fundamental mode is transferred into the second harmonic, and this is fed back to the input of the FBAR 400. Once the oscillator circuit is operating in the second mode, the gain of the second harmonic is then transferred into the fourth harmonic, and this is fed back to the input of the FBAR 400 and so on. This process continues until, for a given multiple $\omega$ of the resonant frequency $\omega_0$, the gain for $2\omega$ is less than for $\omega$. This occurs because the piezoelectric coupling becomes too weak for higher modes, or because the FET gain drops below unity at $2\omega$. In practice, the frequency multiplication is unlikely to go beyond the second harmonic, or the fourth harmonic at best, but this is still useful for certain applications (such as telecommunications).

By amplifying the higher harmonics of the FBAR 400, a higher output frequency can therefore be achieved without the need to reduce the thickness of the piezoelectric material. In this respect, the piezoelectric material may have a thickness of up to 100 nm, 200 nm, 500 nm or 1 μm. The exact thickness required may also depend on the piezoelectric properties of the specific material (which may comprise one or more of lead zirconate titanate, lead titanate, zinc oxide, aluminium nitride, graphene oxide, polytetrafluoroethylene, polypropylene, polyurethane and polyvinylidene fluoride).

Since the gain of the GFET 407 is proportional to the potential difference between the source and drain electrodes (i.e. the DC bias, "$V_{cc}$"), the potential difference can be used to control the frequency of the output signal 414. For example, if the oscillator circuit is working at $4\omega_0$ and $V_{cc}$ is reduced below a predetermined threshold so that the GFET gain for $4\omega_0$ drops below 1, then the circuit will output $2\omega_0$. If $V_{cc}$ is then reduced further, at some point there will be no gain at higher modes and the circuit will revert to the fundamental frequency $\omega_0$. Another way of controlling the output frequency is by adjusting the level of doping of the GFET channel.

Figure 5:
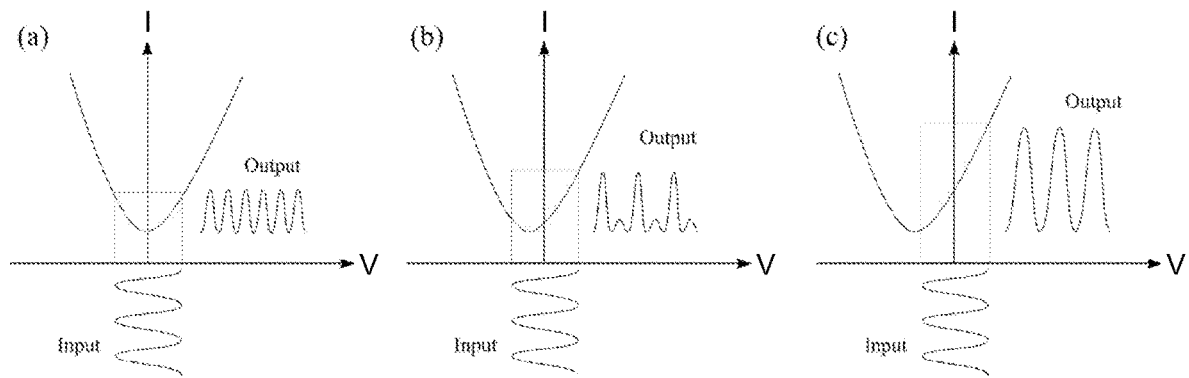
FIGS. 5a-c show the input and output signals for the apparatus of FIG. 2 at different levels of channel doping.

FIGS. 5a-c show the input and output signals at different levels of channel doping. If the graphene channel is perfectly at the Dirac point, the output signal will mostly comprise the second harmonic $2\omega_0$ of the input signal $\omega_0$. As a result, the output signal has twice the frequency as the input signal (FIG. 5a). If, however, the graphene is doped such that the operating point is shifted to the right of the Dirac point, then the output signal becomes asymmetric and retains both $\omega_0$ and $2\omega_0$ components (FIG. 5b). If the level of doping is increased further so that the amplitude of the input signal no longer reaches the Dirac point, then the GFET will act like a standard FET and output a signal with the same frequency as the input $\omega_0$ (FIG. 5c).

Graphene can be doped chemically (i.e. by adding one or more chemical dopants) or electrostatically (i.e. by exposing the graphene to an electric field). Electrostatic doping may be achieved using a gate electrode separated from the channel by a dielectric material. In this way, it is possible to switch between different frequency outputs simply by applying a gate voltage to the gate electrode. For example, if the GFET channel comprises intrinsic graphene (i.e. substantially free of chemical dopants), a gate voltage may be applied to switch from the output signal of FIG. 5a to the output signal of FIG. 5b or 5c. On the other hand, if the FET channel comprises chemically doped graphene (i.e. incorporating one or more chemical dopants), a gate voltage may be applied to switch from the output signal of FIG. 5b or 5c to the output signal of FIG. 5a, or between output signals 5b and 5c.

Graphene is also advantageous as a channel material because it exhibits high charge carrier mobility and tunable conductivity by field-effect. Since GFETs can in principle operate at frequencies of several hundred GHz, it is well-suited to high-frequency signal processing. Graphene can also be transferred from a growth substrate onto almost any substantially flat non-conducting substrate, which facilitates formation of the GFET on top of the FBAR. Additionally or alternatively, graphene may be used to form one or more electrodes of the FET or FBAR. In particular, the FBAR would theoretically perform best if no electrodes at all were required because the electrodes dampen the mechanical oscillations of the piezoelectric material. The closest one can get to this is an electrode with mere atomic thickness, and a single layer of graphene is still remarkably electrically conductive. The use of graphene to form the first and second electrodes of the FBAR therefore allows the quality factor of the FBAR to approach its theoretical limit.

Despite the above emphasis on graphene, one or more of the channel, source, drain and gate electrode of the FET, and/or one or more of the first and second electrodes of the FBAR, may be formed from other conductive two-dimensional materials. Suitable channel materials include reduced graphene oxide, a graphene-like material (such as phosphorene, silicene, germanene, stanene, GaN, InN, InP, InAs, BAs or GaP) or a transition metal dichalcogenide (such as $WX_2$, $MoX_2$, $ScX_2$, $TiX_2$, $HfX_2$, $ZrX_2$, $VX_2$, $CrX_2$, $MnX_2$, $FeX_2$, $CoX_2$, $NiX_2$, $NbX_2$, $TcX_2$, $ReX_2$, $PdX_2$ or $PtX_2$, where X=S, Se or Te). One or more of these materials may exhibit ambipolar conductivity similar to graphene and may therefore be used as described above in relation to FIGS. 5a-c. Suitable electrode materials include reduced graphene oxide or a metal (such as gold, silver, copper, aluminium or chromium).

Figure 6:
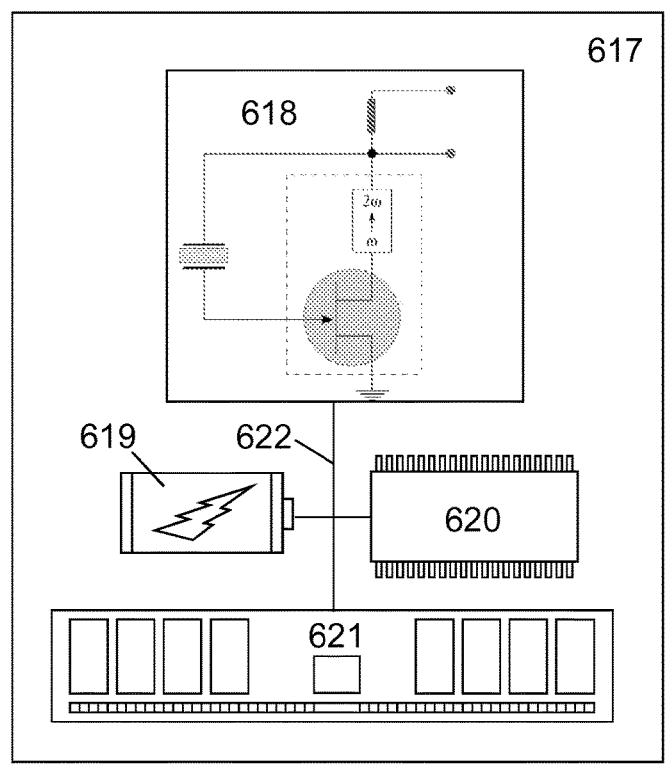
FIG. 6 shows another example of the present apparatus.

FIG. 6 shows another example of the present apparatus 617. The apparatus 617 may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, an oscillator, and a module for one or more of the same. In the example shown, the apparatus 617 comprises the various components described previously (denoted collectively by reference numeral 618), a power supply 619, a processor 620 and a storage medium 621, which are electrically connected to one another by a data bus 622.

The processor 620 is configured for general operation of the apparatus 617 by providing signalling to, and receiving signalling from, the other components to manage their operation. The storage medium 621 is configured to store computer code configured to perform, control or enable operation of the apparatus 617. The storage medium 621 may also be configured to store settings for the other components. The processor 620 may access the storage medium 621 to retrieve the component settings in order to manage the operation of the other components.

Under the control of the processor 620, the power supply 619 is configured to apply a voltage between the first and second electrodes of the FBAR to produce an output signal having a frequency which corresponds to that of the resulting acoustic wave. In addition, the power supply 619 may be configured to apply a voltage between the source and drain electrodes of the FET, and/or apply a voltage to the gate electrode of the FET, to control the frequency of the output signal.

The processor 620 may be a microprocessor, including an Application Specific Integrated Circuit (ASIC). The storage medium 621 may be a temporary storage medium such as a volatile random access memory. On the other hand, the storage medium 621 may be a permanent storage medium such as a hard disk drive, a flash memory, or a non-volatile random access memory. The power supply 619 may comprise one or more of a primary battery, a secondary battery, a capacitor, a supercapacitor and a battery-capacitor hybrid.

Figure 7:
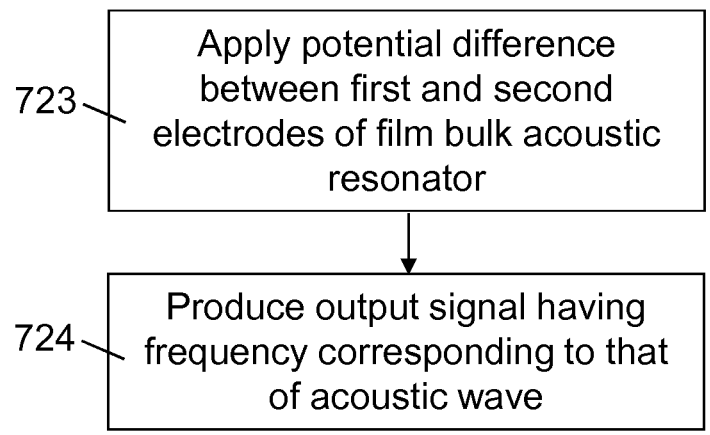
FIG. 7 shows a method of using the present apparatus.

FIG. 7 shows schematically the main steps 723-724 of a method of using the present apparatus. The method generally comprises: applying a potential difference between the first and second electrodes of the FBAR 723; and producing an output signal having a frequency which corresponds to that of the resulting acoustic wave 724.

Figure 8:
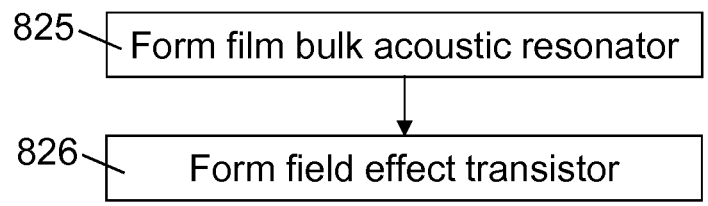
FIG. 8 shows a method of making the present apparatus.

FIG. 8 shows schematically the main steps 825-826 of a method of making the present apparatus. The method generally comprises: forming the FBAR 825; and forming the FET 826.

Figure 9:
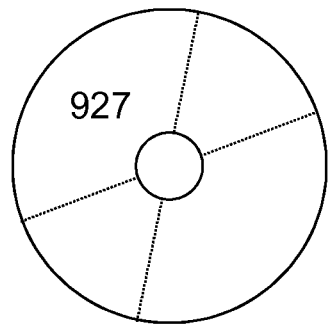
FIG. 9 shows a computer-readable medium comprising a computer program configured to perform, control or enable a method described herein.

FIG. 9 illustrates schematically a computer/processor readable medium 927 providing a computer program according to one embodiment. The computer program may comprise computer code configured to perform, control or enable one or more of the method steps 723-826 of FIG. 7 or 8. In this example, the computer/processor readable medium 927 is a disc such as a digital versatile disc (DVD) or a compact disc (CD). In other embodiments, the computer/processor readable medium 927 may be any medium that has been programmed in such a way as to carry out an inventive function. The computer/processor readable medium 927 may be a removable memory device such as a memory stick or memory card (SD, mini SD, micro SD or nano SD).

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising a film bulk acoustic resonator and a field effect transistor:
    the film bulk acoustic resonator comprising first and second electrodes separated by a piezoelectric material, the piezoelectric material configured such that an application of a potential difference between the first and second electrodes enables generation of an acoustic wave and associated surface charge in the piezoelectric material; and
    the field effect transistor comprising a channel, a source electrode and a drain electrode configured to enable a flow of electrical current through the channel when a potential difference is applied between the source and drain electrodes, the field effect transistor being formed on the piezoelectric material of the film bulk acoustic resonator,
    wherein the first electrode of the film bulk acoustic resonator comprises electrically connected first and second portions, the second portion capacitively coupled to the channel of the field effect transistor via a dielectric material, and
    wherein the first portion of the first electrode is capacitively coupled to the piezoelectric material such that the surface charge generated in the piezoelectric material induces a corresponding charge in the first electrode which causes a variation in the electrical current flowing through the channel via the second portion of the first electrode, the variation in electrical current producing an output signal having a frequency which corresponds to that of the acoustic wave.

2. The apparatus of claim 1, wherein the field effect transistor comprises a gate electrode separated from the channel by a dielectric material, the gate electrode configured to enable the frequency of the output signal to be controlled by applying a voltage to the gate electrode.

3. The apparatus of claim 1, wherein the first portion of the first electrode has a greater area than the second portion of the first electrode.

4. The apparatus of claim 3, wherein the first portion of the first electrode has an area of at least two times the area of the second portion of the first electrode.

5. The apparatus of claim 1, wherein one or more of the channel, the source electrode, the drain electrode, the gate electrode, the first electrode and the second electrode are formed from a conductive two-dimensional material.

6. The apparatus of claim 5, wherein the conductive two-dimensional material comprises one or more of graphene, reduced graphene oxide, a graphene-like material, and a two-dimensional dichalcogenide.

7. The apparatus of claim 5, wherein the conductive two-dimensional material from which the channel is formed exhibits ambipolar conductivity.

8. The apparatus of claim 5, wherein the conductive two-dimensional material from which the channel is formed is substantially free of chemical dopants.

9. The apparatus of claim 5, wherein the conductive two-dimensional material from which the channel is formed comprises one or more chemical dopants configured to vary its electrical conductivity.

10. The apparatus of claim 1, wherein the piezoelectric material is configured such that the generated acoustic wave has a frequency of up to one in a range from 1 GHz to 100 GHz.

11. A method of using an apparatus, the apparatus comprising a film bulk acoustic resonator and a field effect transistor:
    the film bulk acoustic resonator comprising first and second electrodes separated by a piezoelectric material, the piezoelectric material configured such that the application of a potential difference between the first and second electrodes enables the generation of an acoustic wave and associated surface charge in the piezoelectric material; and
    the field effect transistor comprising a channel, and source and drain electrodes configured to enable a flow of electrical current through the channel when a potential difference is applied between the source and drain electrodes, the field effect transistor being formed on the piezoelectric material of the film bulk acoustic resonator,
    wherein the first electrode of the film bulk acoustic resonator comprises electrically connected first and second portions, the second portion capacitively coupled to the channel of the field effect transistor via a dielectric material, and
    wherein the first portion of the first electrode is capacitively coupled to the piezoelectric material such that the surface charge generated in the piezoelectric material induces a corresponding charge in the first electrode which causes a variation in the electrical current flowing through the channel via the second portion of the first electrode, the variation in electrical current producing an output signal having a frequency which corresponds to that of the acoustic wave,
    the method comprising applying a potential difference between the first and second electrodes of the film bulk acoustic resonator to produce an output signal having a frequency which corresponds to that of the resulting acoustic wave.

12. The method of claim 11, wherein the method comprises varying the potential difference between the source and drain electrodes of the field effect transistor to control the frequency of the output signal.

13. The method of claim 11, wherein the field effect transistor comprises a gate electrode separated from the channel by a dielectric material, and wherein the method comprises applying a voltage to the gate electrode to control the frequency of the output signal.

14. A method of making an apparatus, the method comprising forming a film bulk acoustic resonator and a field effect transistor:

the film bulk acoustic resonator comprising first and second electrodes separated by a piezoelectric material, the piezoelectric material configured such that the application of a potential difference between the first and second electrodes enables the generation of an acoustic wave and associated surface charge in the piezoelectric material; and the field effect transistor comprising a channel, and source and drain electrodes configured to enable a flow of electrical current through the channel when a potential difference is applied between the source and drain electrodes, the field effect transistor being formed on the piezoelectric material of the film bulk acoustic resonator, wherein the first electrode of the film bulk acoustic resonator comprises electrically connected first and second portions, the second portion capacitively coupled to the channel of the field effect transistor via a dielectric material, and wherein the first portion of the first electrode is capacitively coupled to the piezoelectric material such that the surface charge generated in the piezoelectric material induces a corresponding charge in the first electrode which causes a variation in the electrical current flowing through the channel via the second portion of the first electrode, the variation in electrical current producing an output signal having a frequency which corresponds to that of the acoustic wave.

15. The method of claim 14, wherein the field effect transistor comprises a gate electrode separated from the channel by a dielectric material, the gate electrode configured to enable the frequency of the output signal to be controlled by applying a voltage to the gate electrode.

16. The method of claim 14, wherein the first portion of the first electrode has a greater area than the second portion of the first electrode.

17. The method of claim 16, wherein the first portion of the first electrode has an area of at least two times the area of the second portion of the first electrode.

18. The method of claim 14, wherein one or more of the channel, the source electrode, the drain electrode, the gate electrode, the first electrode and the second electrode are formed from a conductive two-dimensional material.

* * * * *